United States Patent
Chu et al.

(10) Patent No.: US 11,164,510 B2
(45) Date of Patent: Nov. 2, 2021

(54) DISPLAY SCREENS

(71) Applicant: HEWLETT-PACKARD DEVELOPMENT COMPANY, L.P., Spring, TX (US)

(72) Inventors: Wei Kuang Chu, Taipei (TW); Kuan-Ting Wu, Taipei (TW); Chi-Hao Chang, Taipei (TW)

(73) Assignee: Hewlett-Packard Development Company, L.P., Spring, TX (US)

( * ) Notice: Subject to any disclaimer, the term of this patent is extended or adjusted under 35 U.S.C. 154(b) by 37 days.

(21) Appl. No.: 16/603,387

(22) PCT Filed: Apr. 14, 2017

(86) PCT No.: PCT/US2017/027554
§ 371 (c)(1),
(2) Date: Oct. 7, 2019

(87) PCT Pub. No.: WO2018/190856
PCT Pub. Date: Oct. 18, 2018

(65) Prior Publication Data
US 2021/0090487 A1    Mar. 25, 2021

(51) Int. Cl.
*G09G 3/32* (2016.01)
*H01L 25/075* (2006.01)

(52) U.S. Cl.
CPC ........... *G09G 3/32* (2013.01); *H01L 25/0753* (2013.01); *G09G 2300/0443* (2013.01); *G09G 2320/028* (2013.01); *G09G 2320/068* (2013.01); *G09G 2358/00* (2013.01)

(58) Field of Classification Search
CPC .............. G09G 3/32; G09G 2320/028; G09G 2300/0443; G09G 2358/00; G09G 2320/068; H01L 25/0753
See application file for complete search history.

(56) References Cited

U.S. PATENT DOCUMENTS

| | | | |
|---|---|---|---|
| 10,559,630 B2 * | 2/2020 | Schubert | H01L 51/5275 |
| 2010/0188324 A1 * | 7/2010 | Ohashi | G02F 1/133603 |
| | | | 345/102 |
| 2011/0018860 A1 | 1/2011 | Parry-Jones et al. | |
| 2011/0116017 A1 | 5/2011 | Gere | |

(Continued)

FOREIGN PATENT DOCUMENTS

| | | |
|---|---|---|
| GB | 2410116 A | 7/2005 |
| WO | WO-2016062834 A2 | 4/2016 |

OTHER PUBLICATIONS

Switchable Privacy Display Technology, < http://www.younglighting.com/core_con.php?lang=en&idept=3&isdept=1 >.

*Primary Examiner* — Andrew Sasinowski
(74) *Attorney, Agent, or Firm* — HP Inc. Patent Department

(57) ABSTRACT

The present subject matter relates to display screens. In an example, a display screen includes a first set of pixels, where micro-LEDs of the first set of pixels are to emit light in a first direction from the display screen, and a second set of pixels, where micro-LEDs of the second set of pixels are to emit light in a second direction from the display screen. The second direction is different from the first direction.

15 Claims, 6 Drawing Sheets

(56) References Cited

U.S. PATENT DOCUMENTS

| | | | |
|---|---|---|---|
| 2011/0175936 A1* | 7/2011 | Smith | G02B 30/27 |
| | | | 345/690 |
| 2011/0284881 A1* | 11/2011 | Shikina | G09G 3/3233 |
| | | | 257/88 |
| 2014/0283100 A1 | 9/2014 | Harrison | |
| 2017/0133818 A1* | 5/2017 | Cok | G02F 1/133603 |
| 2020/0019016 A1* | 1/2020 | Oketani | H01L 33/0093 |
| 2020/0135703 A1* | 4/2020 | Ahmed | G02B 1/002 |

* cited by examiner

DISPLAY SCREENS

BACKGROUND

Electronic devices, such as desktop computers, laptops, tablets, and mobile phones, may have a display screen for displaying contents to users. The display screen of such devices may include a micro light emitting diode (LED) display screen, an organic LED display screen, a polymer LED display screen, and the like.

BRIEF DESCRIPTION OF DRAWINGS

The following detailed description references the drawings, wherein.

DETAILED DESCRIPTION

Figure 1:
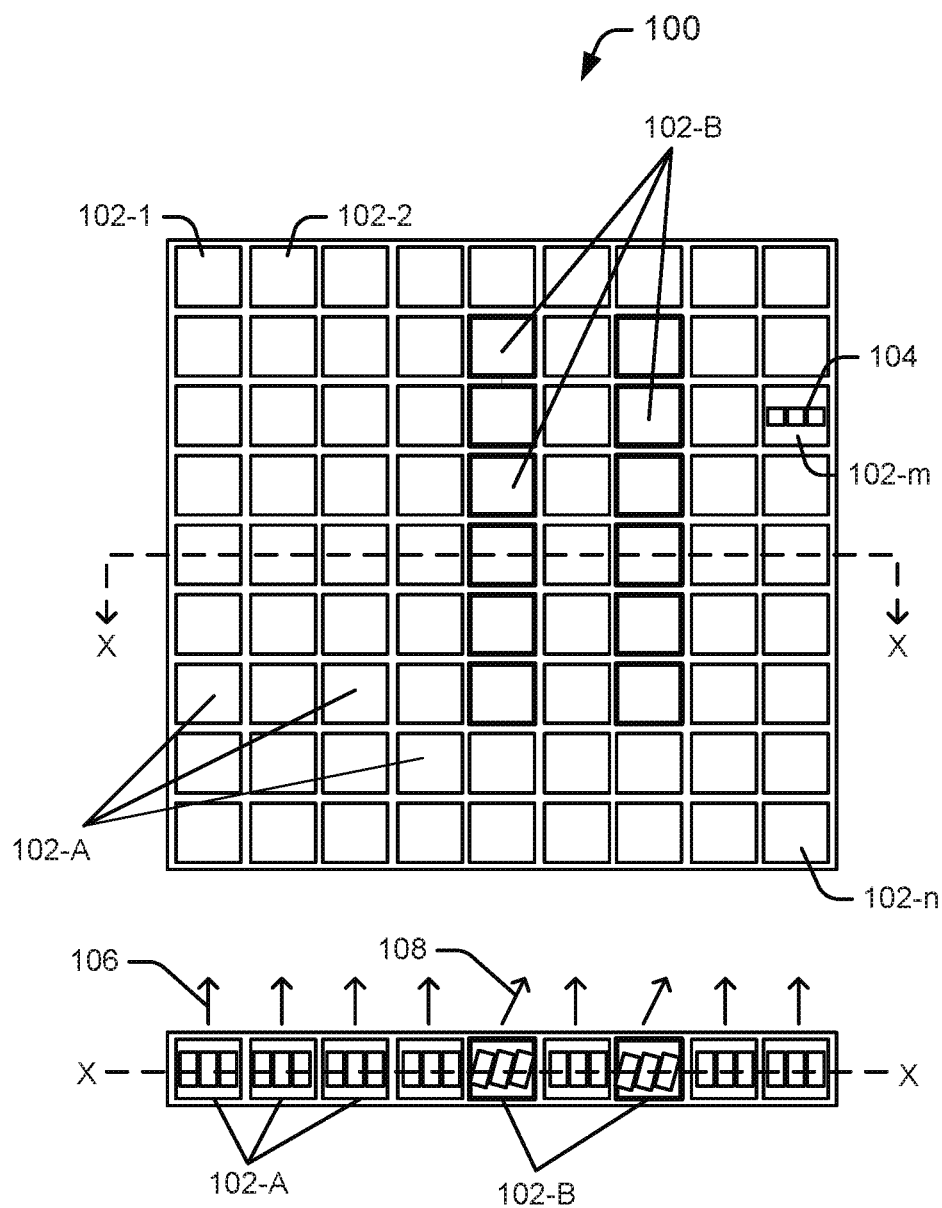
FIG. 1 illustrates a display screen, according to an example implementation of the present subject matter.

Electronic devices, for example, desktop computers, laptops, tablets, and smartphones, are often utilized by users for performing activities which involve accessing data. The accessed data may be displayed on a display screen of a display device associated with the electronic device. The display device, associated with the electronic device, may include a micro light emitting diode (LED) based display screen. Such a display screen may have pixels that can be selectively excited for displaying data. The pixels may be color pixels. Each color pixel may be composed of at least three micro-LEDs, one each of red, green, and blue color.

The electronic devices may also be utilized by users for online banking, trading, insurance, finance, writing exams, accessing medical records, etc. Such activities may involve accessing users' personal data and displaying such data on the display screen of the display device associated with the electronic device. The users' personal data, displayed on the display screen, may be sensitive to be viewed by others who are in the vicinity of the display screen.

All the pixels of a micro-LED based display screen generally emit light in the same direction. The data displayed on the display screen is visible, when viewed from the front of the display screen along the direction of emission of light. The light emitted from all the pixels of the micro-LED based display screen also has a beam width. Thus, the data displayed on the display screen is also viewable from a range of directions spanned about the direction of emission of light, in front of the display screen. With data being viewable from a range of directions, the security of personal data of users may be affected. Such data may have to be protected from prying eyes in the vicinity of the display screen.

The present subject matter describes approaches of controlling viewing directions of displays from micro-LED based display screens. A direction of viewing may refer to the direction from which data displayed on the display screen is visible or viewable. The approaches of the present subject matter can be utilized to protect and maintain privacy of the displayed data from prying eyes in a simple and cost effective manner.

In accordance with an example implementation of the present subject matter, a display screen includes a plurality of pixels. Each of the plurality of pixels being composed of micro-LEDs, for example, red-green-blue (RGB) micro-LEDs. The plurality of pixels of the display screen includes at least two distinct sets of pixels, where micro-LEDs of a first set of pixels, when operated, emit light in a first direction from the plane of the display screen, and micro-LEDs of a second set of pixels, when operated, emit light in a second direction from the plane of the display screen. The second direction is different from the first direction. The light emitted from both the sets of pixels has the same beam width.

With the display screen of the present subject matter, the first set of pixels and the second set of pixels can be selectively operated, in real-time, to control and restrict the direction of viewing of displays from the display screen. In an example implementation, the micro-LEDs of the first set of pixels may be switched ON and the micro-LEDs of the second set of pixels may be switched OFF to restrict the directions of viewing about the first direction from the plane of the display screen. Alternately, the micro-LEDs of the first set of pixels may be switched OFF and the micro-LEDs of the second set of pixels may be switched ON to restrict the directions of viewing about the second direction from the plane of the display screen. The directions of viewing about the first direction and about the second direction depend on the beam width of light emitted by the respective micro-LEDs. Thus, when the micro-LEDs of the first set of pixels are switched ON and the micro-LEDs of the second set of pixels are switched OFF, the contents from the display screen cannot be viewed from outside the directions of viewing about the first direction. Similarly, when the micro-LEDs of the first set of pixels are switched OFF and the micro-LEDs of the second set of pixels are switched ON, the contents from the display screen cannot be viewed from outside the directions of viewing about the second direction. Controlling and restricting the directions of viewing of displays from display screens facilitate to protect and maintain privacy of data displayed on display screens.

The following detailed description refers to the accompanying drawings. Wherever possible, the same reference numbers are used in the drawings and the following description to refer to the same or similar parts. While several examples are described in the description, modifications, adaptations, and other implementations are possible.

Accordingly, the following detailed description does not limit the disclosed examples. Instead, the proper scope of the disclosed examples may be defined by the appended claims.

FIG. 1 illustrates a display screen 100, according to an example implementation of the present subject matter. The display screen 100 is a micro-LED based display screen. The display screen 100 includes a plurality of pixels 102-1, 102-2, ..., 102-n, arranged in a plane of the display screen 100. The plurality of pixels may individually and collectively be referred to 102. Each pixel, as depicted for the pixel referenced as 102-m, is composed of micro-LEDs 104. In an example, each pixel may include micro-LEDs of red, green, and blue (RGB) colors.

As shown in FIG. 1, the plurality of pixels 102 include a first set of pixels 102-A and a second set of pixels 102-B. For the sake of clarity, the second set of pixels 102-B are shown with darker boundary lines. The micro-LEDs of the first set of pixels 102-A are implemented to emit light in a first direction 106 from the plane of the display screen 100. The micro-LEDs of the second set of pixels 102-B are implemented to emit light in a second direction 108 from the plane of the display screen 100. The light from the micro-LEDs of the first set of pixels 102-A and the second set of pixels 102-B has the same beam width.

As shown in the sectional view of the display screen 100 in FIG. 1, the first direction 106 and the second direction 108 are different from each other. The direction of emission of light from a micro-LED depends on the orientation or the tilt of the micro-LED. In an example implementation, the first direction 106 may be a direction perpendicular to the plane of the display screen 100, and the second direction 108 may be a direction at an angle +θ° from a normal to the plane of the display screen 100. The first and second directions 106 and 108 as shown in FIG. 1 are example directions. Other directions are also possible.

In an example implementation, the display screen 100 can be operated in two different display modes. In a first display mode, the micro-LEDs of the first set of pixels 102-A are switched ON and the micro-LEDs of the second set of pixels 102-B are switched OFF. Thus, in the first display mode, the display is generated by the first set of pixels 102-A. The display associated with the first set of pixels 102-A is visible when viewed from a range of directions about the first direction 106. In a second display mode, the micro-LEDs of the second set of pixels 102-B are switched ON and the micro-LEDs of the first set of pixels 102-A are switched OFF. Thus, in the second display mode, the display is generated by the second set of pixels 102-B. The display associated with the second set of pixels 102-B is visible when viewed from a range of directions about the second direction 108.

Figure 2A:
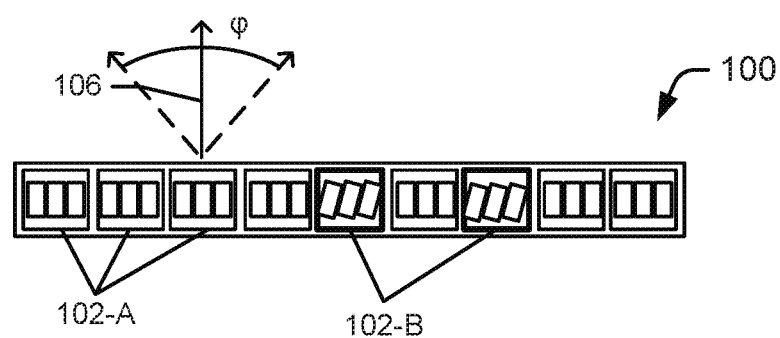
FIG. 2(a) illustrates a range of directions about a first direction in which the display from the display screen of FIG. 1 is visible in a first display mode, according to an example implementation of the present subject matter.
Figure 2B:
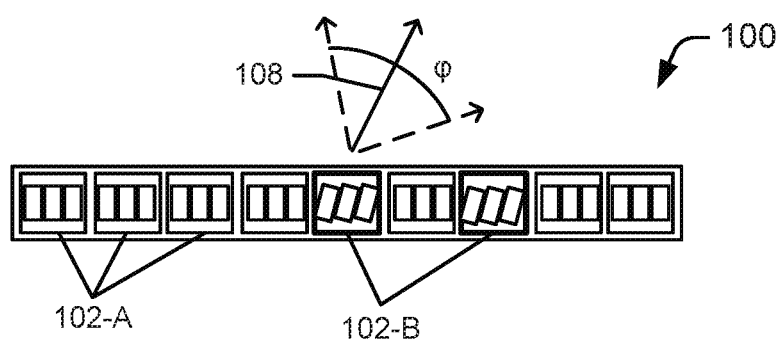
FIG. 2(b) illustrates a range of directions about a second direction in which the display from the display screen of FIG. 1 is visible in a second display mode, according to an example implementation of the present subject matter.

The range of directions about the first direction 106 and about the second direction 108 depends on the beam width of light emitted by the micro-LEDs of the first set of pixels 102-A and of the second set of pixels 102-B, respectively. Since the beam width for the light emitted by the micro-LEDs of the first and second set of pixels is the same, the range of directions about the first direction 106 spans the same angle, for example, 'ϕ', as that spanned by the range of directions about the second direction 108. FIG. 2(a) illustrates the range of directions about the first direction 106 in which the display from the display screen 100 may be visible in the first display mode. FIG. 2(b) illustrates the range of directions about the second direction 108 in which the display from the display screen 100 may be visible in the second display mode. As shown in FIG. 2(a), the display from the first set of pixels 102-A can be viewed from directions spanning the angle ϕ about the first direction 106. As shown in FIG. 2(b), the display from the second set of pixels 102-B can be viewed from directions spanning the angle ϕ about the second direction 108.

Although, the display screen shown in FIG. 1 has two sets of pixels with micro-LEDs that emit light in two distinct directions; however, in an example implementation, display screens may have more than two set of pixels with micro-LEDs that emit light in more than two distinct directions. An example of a display screen with three sets of pixels is illustrated and described through FIG. 3.

Figure 3:
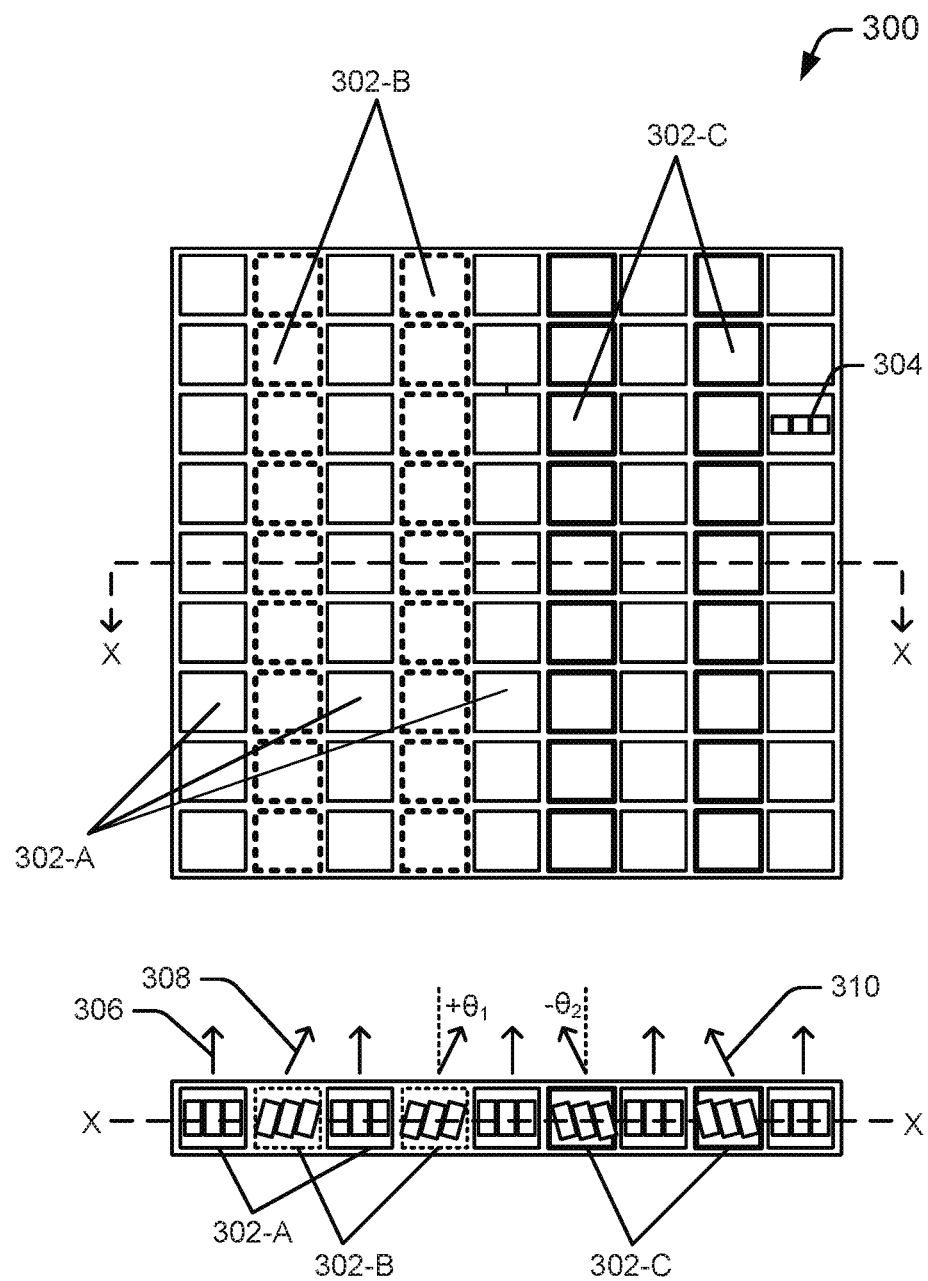
FIG. 3 illustrates a display screen, according to an example implementation of the present subject matter.

FIG. 3 illustrates a display screen 300, according to an example implementation of the present subject matter. The display screen 300 is a micro-LED based display screen including a first set of pixels 302-A, a second set of pixels 302-B, and a third set of pixels 302-C. For the sake of clarity, the second set of pixels 302-B are shown with dotted boundary lines and the third set of pixels 302-C are shown with darker boundary lines. The pixels of the first, second and third sets 302-A, 302-B, 302-C are arranged in a plane of the display screen 300, with each pixel being composed of micro-LEDs 304 of red, green, and blue (RGB) colors.

As shown in FIG. 3, the micro-LEDs of the first set of pixels 302-A are implemented to emit light in a first direction 306 from the plane of the display screen 300. The micro-LEDs of the second set of pixels 302-B are implemented to emit light in a second direction 308 from the plane of the display screen 300. The micro-LEDs of the third set of pixels 302-C are implemented to emit light in a third direction 310 from the plane of the display screen 300. The light from the micro-LEDs of the first set of pixels 302-A, the second set of pixels 302-B, and the third set of pixels 302-C has the same beam width.

The first direction 306, the second direction 308, and the third direction 310 are different from each other. As shown in the sectional view of the display screen 300 in FIG. 3, the first direction 306 is perpendicular to the plane of the display screen 300, the second direction 308 is at an angle of $+\theta_1°$ from the plane of the display screen 300, and the third direction 310 is at an angle of $-\theta_2°$ from the plane of the display screen 300. In an example implementation, the angle of $+\theta_1$ is in a range of +30° to +60°, and the angle of $-\theta_2°$ is in a range of −30° to −60°.

Further, as shown in FIG. 3, the first, second and third sets of pixels 302-A, 302-B, 302-C are arranged row-wise. The first set of pixels 302-A are arranged row-wise across the entire span of the display screen 300. The second set of pixels 302-B are arranged row-wise in a left-portion of the display screen 300, such that adjacent rows of pixels of the second set 302-B are separated by a row of pixels of the first set 302-A. Similarly, the third set of pixels 302-C are arranged row-wise in a right-portion of the display screen 300, such that adjacent rows of pixels of the third set 302-C are separated by a row of pixels of the first set 302-A.

In an example implementation, the display screen 300 can be operated in three different display modes. In a first display mode, the micro-LEDs of the first set of pixels 302-A are switched ON and the micro-LEDs of the second and third sets of pixels 302-B and 302-C are switched OFF. Thus, in the first display mode, the display is generated by the first set of pixels 302-A, which is visible when viewed from a range of directions about the first direction 306. In a second display mode, the micro-LEDs of the second set of pixels 302-B are switched ON and the micro-LEDs of the first and third sets of pixels 302-A and 302-C are switched OFF. Thus, in the second display mode, the display is generated by the second set of pixels 302-B, which is visible when viewed from a range of directions about the second direction 308. Similarly, in a third display mode, the micro-LEDs of the third set of pixels 302-C are switched ON and the micro-LEDs of the first and second sets of pixels 302-A and 302-B are switched OFF. Thus, in the third display mode, the display is generated by the third set of pixels 302-C, which is visible when viewed from a range of directions about the third direction 310. As mentioned earlier, since the beam width for the light emitted by the micro-LEDs of the first, second and third set of pixels 302-A, 302-B, 302-C is same, the range of directions about the directions 306, 308, 310 spans the same angle.

In an example implementation, the display screen 300 can be operated in a normal display mode and a privacy display mode, as described hereinafter.

Figure 4A:
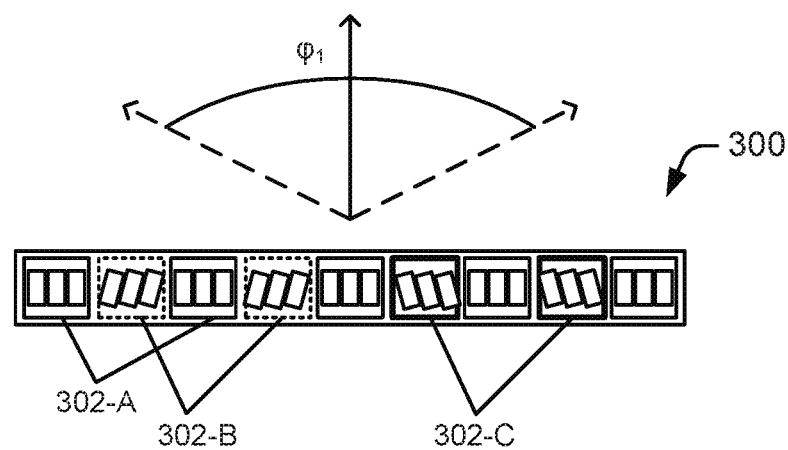
FIG. 4(a) illustrates a range of directions about the perpendicular from the display screen of FIG. 3 in which the display is visible in a normal display mode, according to an example implementation of the present subject matter.

In the normal display mode, the micro-LEDs of the first set of pixels 302-A are switched ON and the micro-LEDs of the second and third sets of pixels 302-B and 302-C are switched OFF. Since the first set of pixels 302-A are present across the entire display screen 300, in the normal display mode, the entire display screen 300 is visible when viewed from a range of directions about the perpendicular from the display screen 300. FIG. 4(a) illustrates the range of about the perpendicular from the display screen 300 in which the display from the display screen 300 may be visible in the normal display mode. As shown in FIG. 4(a), the display from the display screen 300 can be viewed from directions spanning the angle $\phi_1$ about the perpendicular from the display screen 300.

Figure 4B:
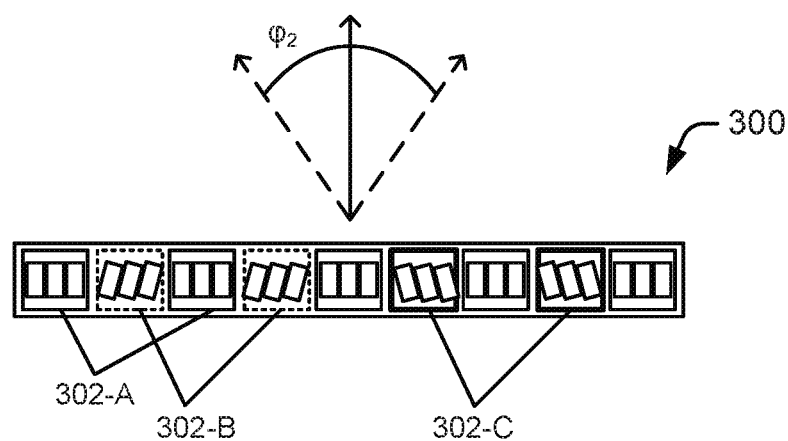
FIG. 4(b) illustrates a range of directions about the perpendicular from the display screen of FIG. 3 in which the display is visible in a privacy display mode, according to an example implementation of the present subject matter.

In the privacy display mode, the micro-LEDs of the first set of pixels 302-A are switched OFF and the micro-LEDs of the second and third sets of pixels 302-B and 302-C are switched ON. Thus, in the privacy display mode, the display from the left-portion of the display screen 300 is generated by the second set of pixels 302-B and the display from the right-portion of the display screen 300 is generated by the third set of pixels 302-C. Since the second set of pixels 302-B emit light at an angle $+\theta_1°$ from the normal and the third set of pixels 302-C emit light at an angle $-\theta_0°$ from the normal, the combined effect of such light emissions restricts or narrows the range or the span of directions from which the display from the display screen 300 is viewable. Thus, the display associated with the second and third sets of pixels 302-B and 302-C is viewable in a narrower range of directions, which helps in protecting and maintaining privacy of data displayed on the display screen 300. FIG. 4(b) illustrates the range of directions from the display screen 300 in which the display from the display screen 300 may be visible in the privacy display mode. As shown in FIG. 4(b), the display from the display screen 300 can be viewed from directions spanning the angle $\phi_2$ about the perpendicular from the display screen 300. The angle $\phi_2$ is smaller than the angle $\phi_1$.

In an example implementation, the display screen 100 or the display screen 300 may be implemented in a display device of an electronic device. The display device may be a display monitor for a desktop computer, a display unit of a laptop, a display unit of a tablet or a smartphone, and such.

Figure 5:
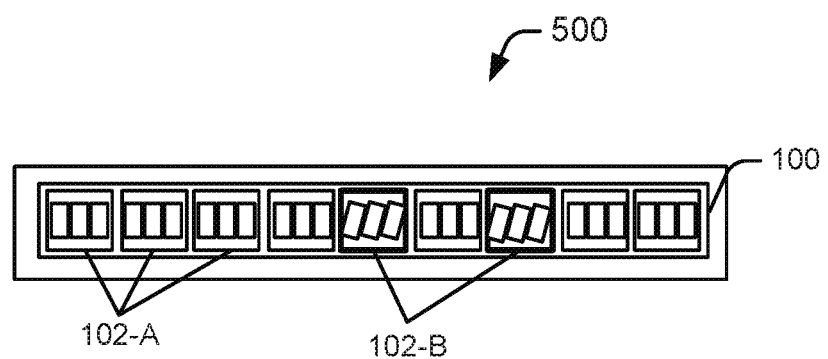
FIG. 5 illustrates a display device with the display screen of FIG. 1, according to example implementations of the present subject matter.

FIG. 5 illustrates a display device 500 with the display screen 100 of FIG. 1, according to example implementations of the present subject matter. The display device 500 may be implemented in various ways. For example, the display device 500 may be implemented as monitors for desktop computers, and display units of laptops, mobile phones, tablets, electronic readers, etc.

The display device 500, apart from the display screen 100, may include other electronic components and circuitry (not shown in FIG. 5) for operating the display screen 100. The display device 500, for example, may include a display mode controller (not shown in FIG. 5). The display mode controller is electrically coupled to the micro-LEDs of the pixels of the display screen 100. The display mode controller is electrically coupled to the first set of pixels 102-A and the second set pf pixels 102-B through separate electrical connection lines so that the display mode controller can separately and selectively provide voltages across the first set of pixels 102-A and the second set of pixels 102-B. The display mode controller may be coupled to the first set of pixels 102-A through a first electrical connection line (not shown in FIG. 5) and is coupled to the second set of pixels 102-B through a second electrical connection line (not shown in FIG. 5).

In an example implementation, the display mode controller may operate the display screen 100 in a first display mode in which the display mode controller is to switch ON the micro-LEDs of the first set of pixels 102-A and switch OFF the micro-LEDs of the second set of pixels 102-B. The direction in which the display from the display screen 100 is viewable in the first display mode is as described earlier with reference to the description of FIG. 1. The display mode controller may operate the display screen 100 in a second display mode in which the display mode controller is to switch ON the micro-LEDs of the second set of pixels 102-B and switch OFF the micro-LEDs of the first set of pixels 102-A. The direction in which the display from the display screen 100 is viewable in the second display mode is as described earlier with reference to the description of FIG. 1.

In an example implementation, the display mode controller may receive a user input indicative of the first display mode or the second display mode, as selected by a user. The display mode controller may provide voltages to the micro-LEDs of the first set of pixels 102-A or the second set of pixels 102-B depending on the mode selected by the user.

Figure 6:
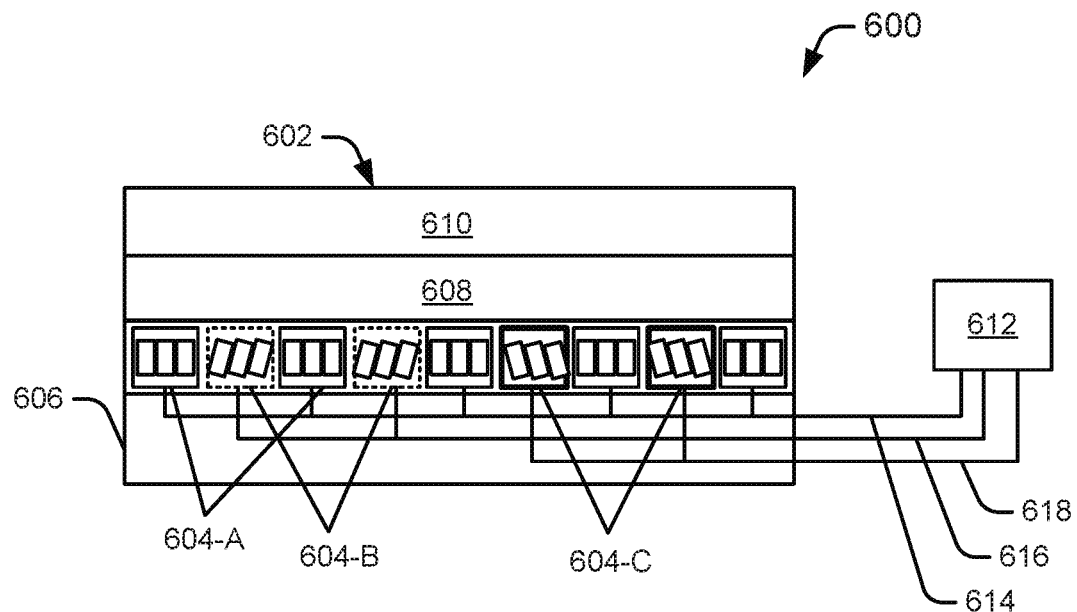
FIG. 6 illustrates a sectional view of a display device with a display screen, according to example implementations of the present subject matter.

FIG. 6 illustrates a display device 600 with a display screen 602, according to example implementations of the present subject matter. The display device 600 may be implemented as monitors for desktop computers, and display units of laptops, mobile phones, tablets, electronic readers, etc. The display screen 602 includes a first set of pixels 604-A, a second set of pixels 604-B, and a third set of pixels 604-C, similar to those of the display screen 300 shown in FIG. 3. The micro-LEDs of the first set of pixels 604-A are implemented to emit light in a direction perpendicular to the plane of the display screen 602. The micro-LEDs of the second set of pixels 604-B are implemented to emit light in a direction at an angle of $+\theta_1°$ from the plane of the display screen 602. The micro-LEDs of the third set of pixels 604-C are implemented to emit light in a direction at an angle of $-\theta_2°$ from the plane of the display screen 602. The light from the micro-LEDs of the first set of pixels 604-A, the second set of pixels 604-B, and the third set of pixels 604-C has the same beam width. In an example implementation, the angle of $+\theta_1°$ is in a range of $+30°$ to $+60°$, and the angle of $-\theta_2°$ is in a range of $-30°$ to $-60°$.

Further, as shown in FIG. 6, the display screen 602 includes a reflector layer 606 arranged below the pixels. The reflector layer 606 is to reflect the light which may leak out below the micro-LEDs. The reflector layer 606 may of a thickness in a range of about 0.09 mm to about 0.15 mm, and may be made of silver or aluminum. The display screen 602 also includes an optical film 608 arranged above the pixels. The optical film 608 may of a thickness in a range of about 0.5 mm to about 2 mm, and may be made of polycarbonate, acrylic, or cyclic olefin copolymer. The optical film 608 may include an optical prism film, or a brightness enhancing film, which may facilitate in improving the quality of display from the display screen. The display screen 602 further includes a glass or plastic film 610 above the optical film 608. The glass or plastic film may of a thickness in a range of about 0.3 mm to about 1 mm, and may be made of borosilicate, soda-lime glass, polyester, polyamine, polycarbonate, and such. The glass or plastic film 610 may form the top layer of the display screen 602 which may provide durability to the display screen 602.

The display device 600 may include electronic components and circuitry for operating the display screen 602. For example, the display device 600 includes a display mode controller 612. The display mode controller 612 is electrically coupled to the micro-LEDs of the pixels of the display screen 100. The display mode controller 612 is coupled to the first, second and third sets of pixels 604-A, 604-B, 604-C through a first electrical connection line 614, a second electrical connection line 616, and a third electrical connection line 618, respectively.

In an example implementation, the display mode controller 612 may operate the display screen 602 in a normal display mode in which the display mode controller 612 is to switch ON the micro-LEDs of the first set of pixels 604-A and switch OFF the micro-LEDs of the second and third sets of pixels 604-B and 604-C. The direction in which the display from the display screen 602 is viewable in the normal display mode is as described earlier with reference to the description of FIG. 3. The display mode controller 612 may operate the display screen 602 in a privacy display mode in which the display mode controller 612 is to switch ON the micro-LEDs of the second and third sets of pixels 604-B and 604-C, and switch OFF the micro-LEDs of the first set of pixels 604-A. The direction in which the display from the display screen 602 is viewable in the privacy display mode is as described earlier with reference to the description of FIG. 3.

In an example implementation, the display mode controller 612 may receive a user input indicative of the normal display mode or the privacy display mode, as selected by a user. The display mode controller 612 may accordingly provide voltages to the micro-LEDs depending on the mode selected by the user.

Figure 7:
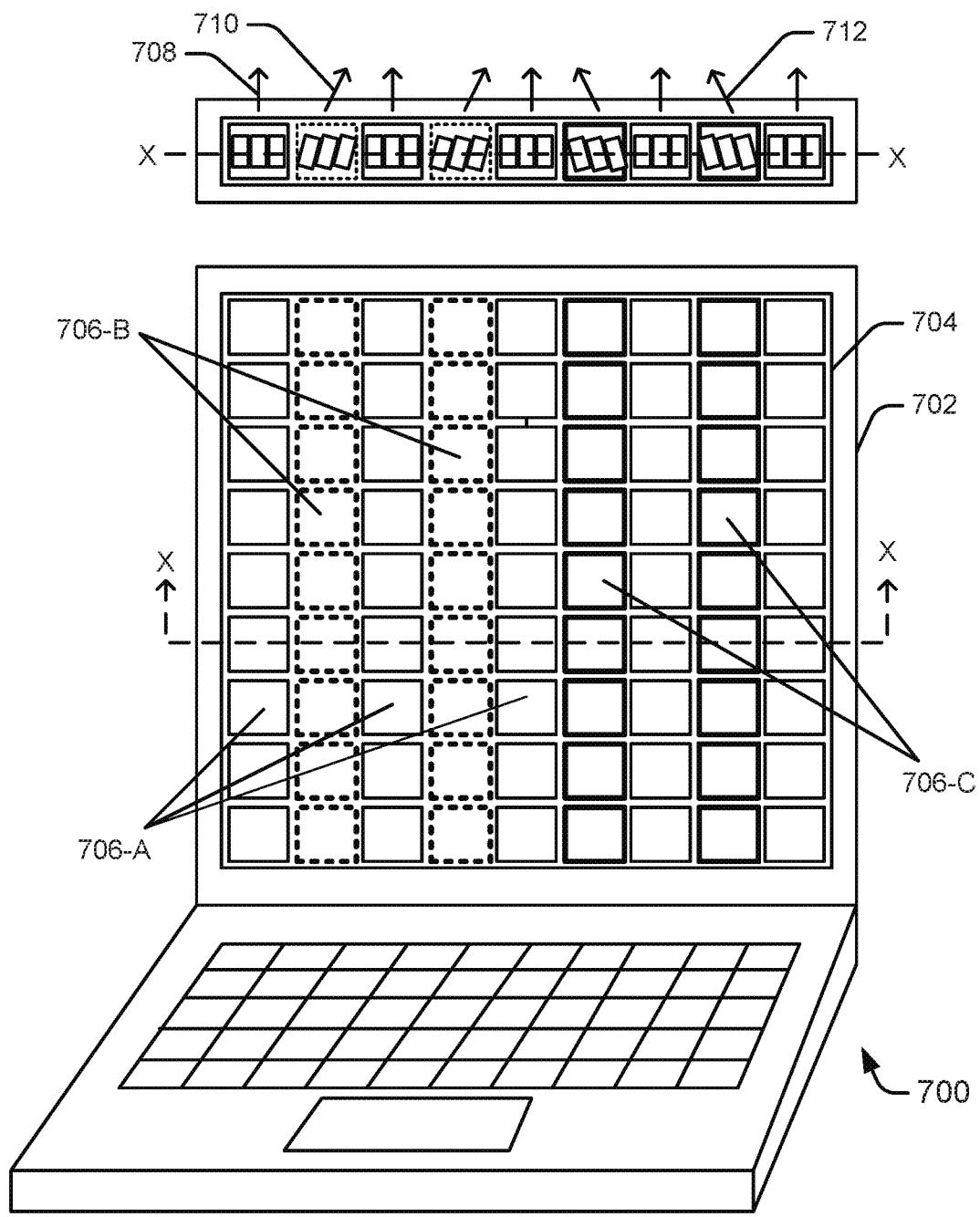
FIG. 7 illustrates an electronic device having a display device with a display screen, according to an example implementation of the present subject matter.

FIG. 7 illustrates an electronic device 700 having a display device 702 with a display screen 704, according to an example implementation of the present subject matter. Although, the electronic device 700 is shown as a laptop, in an example implementation, the electronic device may be a desktop computer, mobile phones, tablets, electronic readers, etc.

The display screen 704, as shown in FIG. 7, includes a first set of pixels 706-A, a second set of pixels 706-B, and a third set of pixels 706-C. The pixels of the first, second and third sets 706-A, 706-B, 706-C are arranged row-wise in a plane of the display screen 704, with each pixel being composed of micro-LEDs of red, green, and blue (RGB) colors. As shown in FIG. 7, the first set of pixels 706-A are arranged across the entire span of the display screen 704. The second set of pixels 706-B are arranged in a left-portion of the display screen 706, such that adjacent rows of pixels of the first set 706-A present on the left-portion are separated by a row of pixels of the second set 706-B. Similarly, the third set of pixels 706-C are arranged in a right-portion of the display screen 704, such that adjacent rows of pixels of the first set 706-A present on the right-portion are separated by a row of pixels of the third set 706-C.

The micro-LEDs of the first set of pixels 706-A are implemented to emit light in a first direction 708 from the plane of the display screen 704. The micro-LEDs of the second set of pixels 706-B are implemented to emit light in a second direction 710 from the plane of the display screen 704. The micro-LEDs of the third set of pixels 706-C are implemented to emit light in a third direction 712 from the plane of the display screen 704. The light from all the micro-LEDs of the display screen 704 has the same beam width.

In an example implementation, the first direction 708 is perpendicular to the plane of the display screen 704, the second direction 710 is at an angle of $+\theta_1°$ from the plane of the display screen 704, and the third direction 712 is at an angle of $-\theta_2°$ from the plane of the display screen 704. In an example implementation, the angle of $+\theta_1°$ is in a range of $+30°$ to $+60°$, and the angle of $-\theta_2°$ is in a range of $-30°$ to $-60°$.

The electronic device 700 may include a display mode controller (not shown). The display mode controller may be electrically coupled to the micro-LEDs of the pixels of the display screen 704. The display mode controller is electrically coupled to the first set of pixels 706-A, the second set of pixels 706-B, and the third set pf pixels 706-C through separate electrical connection lines so that the display mode controller can separately and selectively provide voltages across each of the sets of pixels.

In an example implementation, the display mode controller may operate the display screen 704 in a normal display mode in which the display mode controller is to switch ON the micro-LEDs of the first set of pixels 706-A and switch OFF the micro-LEDs of the second and third sets of pixels 706-B and 706-C. The direction in which the display from the display screen 704 is viewable in the normal display mode is as described earlier with reference to the description of FIG. 3. The display mode controller may operate the display screen 704 in a privacy display mode in which the display mode controller is to switch ON the micro-LEDs of the second and third sets of pixels 706-B and 706-C, and switch OFF the micro-LEDs of the first set of pixels 706-A. The direction in which the display from the display screen 704 is viewable in the privacy display mode is as described earlier with reference to the description of FIG. 3.

In an example implementation, the display mode controller described in the description, amongst other things, may include routines, programs, objects, components, data structures, and the like, which perform particular tasks or implement particular abstract data types. The display mode controller may be coupled to, and executed by, a processor (not shown) to perform various functions for the purposes of operating the display device in one of the display modes, in accordance with the present subject matter. In an example implementation, the processor may be implemented as microprocessors, microcomputers, microcontrollers, digital signal processors, central processing units, state machines, logic circuitries, and/or any devices that manipulate signals based on operational instructions. Among other capabilities, the processor may fetch and execute computer-readable instructions stored in a memory coupled to the processor. The memory may be a memory of the display mode controller, and may include any non-transitory computer-readable storage medium including, for example, volatile memory (e.g., RAM), and/or non-volatile memory (e.g., EPROM, flash memory, NVRAM, memristor, etc.). The functions of the display mode controller may be provided through the use of dedicated hardware as well as hardware capable of executing computer-readable instructions.

Although implementations for display screens, display devices, and electronic devices have been described in language specific to structural and functional features, it is to be understood that the present subject matter is not limited to the specific features described. Rather, the specific features are disclosed and explained as example implementations for display screens, display devices, and electronic devices.

What is claimed is:

1. A display screen comprising:
a plurality of pixels arranged in a plane of the display screen, each pixel, of the plurality of pixels, being composed of micro-LEDs, wherein the plurality of pixels comprises:
a first set of pixels, wherein micro-LEDs of the first set of pixels are to emit light in a first direction from the plane of the display screen that is at an angle of $+\theta_1°$ from a normal to the plane of the display screen; and
a second set of pixels, wherein micro-LEDs of the second set of pixels are to emit light in a second direction from the plane of the display screen, the second direction at an angle of $-\theta_2°$ from the normal to the plane of the display screen.

2. The display screen as claimed in claim 1, wherein the plurality of pixels comprises:
a third set of pixels, wherein micro-LEDs of the third set of pixels are to emit light in a third direction from the plane of the display screen, the third direction being different from the first and second directions.

3. The display screen as claimed in claim 2, wherein, the micro-LEDs of the third set of pixels are to emit light perpendicular to the plane of the display screen.

4. The display screen as claimed in claim 3, wherein, the third set of pixels are arranged row-wise;
the second set of pixels is arranged row-wise in a left-portion of the display screen, adjacent rows of pixels of the second set are separated by a row of pixel of the third set; and
the first set of pixels is arranged row-wise in a right-portion of the display screen, adjacent rows of pixels of the first set are separated by a row of pixels of the third set.

5. The display screen as claimed in claim 3, wherein the angle of $+\theta_1°$ is in a range of +30° to +60°, and the angle of $-\theta_2°$ is in a range of −30° to −60°.

6. The display device as claimed in claim 1, comprising a display mode controller electrically coupled to the micro-LEDs of the plurality of pixels, wherein,
in a first display mode, the display mode controller is to switch ON the micro-LEDs of the first set of pixels and switch OFF the micro-LEDs of the second set of pixels; and
in a second display mode, the display mode controller is to switch ON the micro-LEDs of the second set of pixels and switch OFF the micro-LEDs of the first set of pixels.

7. The display device as claimed in claim 1, comprising a display mode controller electrically coupled to the micro-LEDs of the plurality of pixels, wherein, in a normal display mode, the display mode controller is to:
switch ON the micro-LEDs of the third set of pixels; and
switch OFF the micro-LEDs of the first and second sets of pixels.

8. A display device comprising:
a display screen having a plurality of pixels, each pixel, of the plurality of pixels, being composed of micro-LEDs, wherein,
micro-LEDs of a first set of pixels, from the plurality of pixels, are to emit light in a first direction from the display screen;
micro-LEDs of a second set of pixels, from the plurality of pixels, are to emit light, from the display screen, in a second direction different from the first direction, wherein the light from the micro-LEDs of the second set of pixels has the same beam width as that of the light emitted from the micro-LEDs of the first set of pixels and the second set of pixels are arranged in a left-portion of the display screen; and
micro-LEDs of a third set of pixels, from the plurality of pixels, are to emit light in a third direction different from the first and second directions, wherein the light from the micro-LEDs of the first, second and third sets of pixels have the same beam width and the third set of pixels are arranged in a right-portion of the display screen.

9. The display device as claimed in claim 8, comprising a display mode controller electrically coupled to the micro-LEDs of the plurality of pixels, wherein,
in a first display mode, the display mode controller is to switch ON the micro-LEDs of the first set of pixels and switch OFF the micro-LEDs of the second set of pixels; and
in a second display mode, the display mode controller is to switch ON the micro-LEDs of the second set of pixels and switch OFF the micro-LEDs of the first set of pixels.

10. The display device as claimed in claim 9, wherein, the micro-LEDs of the first set of pixels are to emit light perpendicular to a plane of the display screen;
the micro-LEDs of the second set of pixels are to emit light at an angle of $+\theta_1°$ from a normal to the plane of the display screen; and
the micro-LEDs of the third set of pixels are to emit light at an angle of $-\theta_2°$ from the normal to the plane of the display screen.

11. The display device as claimed in claim 10, comprising a display mode controller electrically coupled to the micro-LEDs of the plurality of pixels, wherein, in a normal display mode, the display mode controller is to:
switch ON the micro-LEDs of the first set of pixels; and
switch OFF the micro-LEDs of the second and third sets of pixels.

12. The display device as claimed in claim 11, wherein, in a privacy display mode, the display mode controller is to:
switch ON the micro-LEDs of the second and third sets of pixels; and
switch OFF the micro-LEDs of the first set of pixels.

13. An electronic device comprising:
a display device having a display screen, the display screen comprising:
a first set of pixels arranged row-wise in a plane of the display screen, each pixel of the first set of pixels being composed of micro-LEDs that emit light in a first direction from the plane of the display screen;
a second set of pixels arranged row-wise in the plane of the display screen, each pixel of the second set of pixels being composed of micro-LEDs that emit light in a second direction from the plane of the display screen, the second direction being different from the first direction; and
a third set of pixels arranged row-wise in the plane of the display screen, each pixel of the third set of pixels being composed of micro-LEDs that emit light in a third direction from the plane of the display screen, the third direction being different from the first and second directions, wherein:

the micro-LEDs of the first set of pixels are to emit light perpendicular to the plane of the display screen;

the second set of pixels are arranged in a left-portion of the display screen, the micro-LEDs of the second set of pixels are to emit light at an angle of $+\theta_1°$ from a normal to the plane of the display screen; and third set of pixels are arranged in a right-portion of the display screen, the micro-LEDs of the third set of pixels are to emit light at an angle of $-\theta_2°$ from the normal to the plane of the display screen.

14. The electronic device as claimed in claim 13, wherein adjacent rows of the first set of pixels present on a left-portion of the display screen are separated by a row of the second set of pixels, and wherein adjacent rows of the first set of pixels present on a right-portion of the display screen are separated by a row of the third set of pixels.

15. The electronic device as claimed in claim 13, comprising a display mode controller electrically coupled to the micro-LEDs of the first, second and third sets of pixels, wherein, in a normal display mode, the display mode controller is to switch ON the micro-LEDs of the first set of pixels and switch OFF the micro-LEDs of the second and third sets of pixels; and in a privacy display mode, the display mode controller is to switch ON the micro-LEDs of the second and third sets of pixels and switch OFF the micro-LEDs of the first set of pixels.

* * * * *